United States Patent [19]
Haller

[11] Patent Number: 5,254,488
[45] Date of Patent: Oct. 19, 1993

[54] EASILY MANUFACTURABLE THIN FILM TRANSISTOR STRUCTURES

[75] Inventor: Ivan Haller, Chappaqua, N.Y.

[73] Assignee: International Business Machines Corporation, Armonk, N.Y.

[21] Appl. No.: 581,316

[22] Filed: Sep. 4, 1990

Related U.S. Application Data

[60] Continuation of Ser. No. 412,714, Sep. 26, 1989, abandoned, which is a division of Ser. No. 140,699, Jan. 4, 1988, Pat. No. 4,888,632.

[51] Int. Cl.$^5$ .......................................... H01L 21/265
[52] U.S. Cl. ........................................ 437/40; 437/41; 437/43; 437/181; 437/909
[58] Field of Search .................... 437/181, 40, 41, 43, 437/229, 909

[56] References Cited

FOREIGN PATENT DOCUMENTS 0090661 10/1983 European Pat. Off. ............ 437/181

Primary Examiner—Brian E. Hearn
Assistant Examiner—Tuan Nguyen
Attorney, Agent, or Firm—Thomas J. Kilgannon; Jeffrey S. LaBaw; Jeffrey L. Brandt

[57] ABSTRACT

An improved structure and method for fabricating amorphous silicon thin film devices, particularly transistors, is described. In addition to their usual role as gate insulator and optional capping layer, the insulator films are chosen to maximize the transmission of photolithographic active light through the structure. These layers are positioned to either side of the amorphous silicon layer which is a light absorbing layer to act as anti-reflective elements. The insulator layers are chosen to have a refractive index different than the substrate and a thickness dimension chosen so the wave components of said lithographically active light reflected at the interfaces of the completed structure interfere destructively.

9 Claims, 3 Drawing Sheets

EASILY MANUFACTURABLE THIN FILM TRANSISTOR STRUCTURES

This application is a continuation of application Ser. No. 412,714, filed Sep. 26, 1989, now abandoned, which is a divisional of application Ser. No. 140,699, filed Jan. 4, 1988, now issued as U.S. Pat. No. 4,888,632.

BACKGROUND OF THE INVENTION

The present invention relates to a thin film field effect transistor or other thin film semiconductor device, and to a process for producing the same. More particularly, it relates to an improved self-aligned, staggered configuration which allows the underlying insulator films to serve as anti-reflective elements to maximize the transmission of light through the thin film structure during processing.

Thin film field effect transistors, or thin film transistors, are well known in the art. One of their primary uses is in the area of large area flat panel displays, such as liquid crystal displays (LCDs). In such a display, an array of display elements may be interconnected together with thin film transistors via horizontal and vertical bus bars. For example, the gates of one row of thin film transistors are connected to a horizontal bus bar while the sources are connected to the vertical bus bars. When a voltage is applied to a predetermined horizontal bus bar and to a predetermined vertical bus bar, the gate source and drain which form a particular thin film transistor are energized. In the case of an LCD, that part of the liquid crystal which corresponds to the energized transistor becomes transparent.

Amorphous silicon thin film transistors have great potential for low cost and large area liquid crystal displays. Several known processes for fabricating self aligned thin film transistors are particularly attractive. Alignment requires expensive, and in the case of very large size panel displays, presently unavailable tooling. A self aligned process does not require alignment in successive lithographic steps. However, a major drawback of the known self-aligned processes of manufacturing thin film transistors is that they require the exposure of a photolithographic resist through the thin layer of amorphous silicon. Due to the high reflectance and high absorption coefficient of amorphous silicon, long exposure times are required and the contrast between exposed and unexposed areas is reduced.

The reflectance and absorption losses in the structure limit the repeatability of thin film structures manufactured by known methods. Also, the thickness of amorphous silicon must be thinner than the minimum sufficient for device operation to allow the transmission of enough lithographically active light to the photoresist layer. A second amorphous silicon deposition and accompanying photo and etch steps are required after the formation of the source and drain electrodes to provide the necessary thickness of silicon for an operational device.

SUMMARY OF THE INVENTION

It is therefore, an object of the present invention to manufacture a self-aligned thin film transistor in an improved manner.

It is still another object of the present invention to permit lowered photolithographic exposure times and heightened image contrast in photoresist by maximizing the transmission of lithographically active light through the thin film transistor structure.

It is yet another object of the present invention to provide an improved thin film transistor structure which facilitates short exposure times and high image contrast.

These and other objects of the invention are accomplished by an improvement over prior methods of manufacturing thin film semiconductor structures. By utilizing the insulator films adjacent to the amorphous silicon layer in a dual role exposure time and image contrast are optimized. In addition to their usual role as gate insulator and optional capping layer, they are chosen to maximize the transmission of the photolithographically active light through the structure. The insulator layers are positioned to either side of the amorphous silicon layer which is a light absorbing layer to act as anti-reflective elements. The insulator layers are chosen to have a refractive index different from the substrate and with a thickness dimension chosen so that wave components of the lithographically active light reflected at the interfaces of the completed structure interfere destructively. In a simple multilayer structure where none of the layers are light absorbing and each layer has a refractive index between that of each adjacent layer, the thickness of the insulator layer should be approximately equal to an odd multiple of one fourth wavelength of the lithographically active light divided by refractive index of the insulator layer. While the amorphous silicon layer in the present invention is light absorbing, the optimal thickness calculated by precise mathematical methods is close to that given by this simple rule.

DETAILED DISCLOSURE OF THE INVENTION

Figure 1:
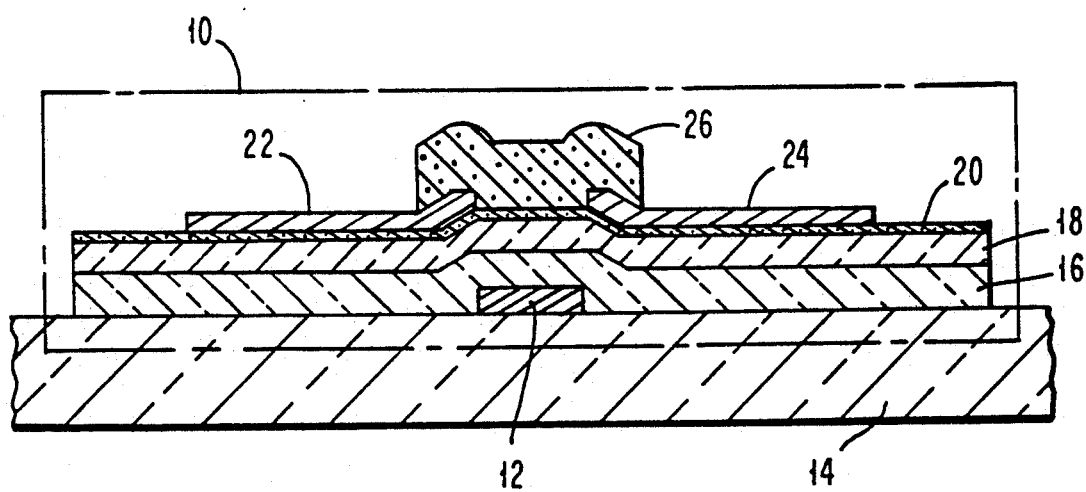
FIG. 1 is a cross-section view of a thin film transistor manufactured in accordance with the present invention.

Referring now to FIG. 1, an amorphous silicon thin film transistor 10 is shown. A metal gate electrode 12 is positioned on the surface of a glass substrate 14. Gate insulator layers 16 and 18 are positioned over the gate electrode 12 and substrate 14. A thin amorphous silicon layer 20 is on top of the gate insulator layers 16 and 18. Source electrode 22 and drain electrode 24 are formed on top of the thin amorphous layer 20. Finally, a second amorphous silicon layer 26 covers both the source 22 and drain 24 electrodes. The amorphous silicon layer 26 is necessary only when the first amorphous silicon layer cannot easily be made 30 nm or thicker. This amount of silicon is necessary to manufacture electrically useful devices. Prior art processes do not allow sufficient light through the structure at these thicknesses of silicon to expose the photoresist adequately. However, through the use of the present invention, short exposure times and high contrast photo images can be made and the amorphous silicon layer 26 can be eliminated.

The substrate 14 need not be glass, but can also be a plastic transparent to the lithographically active wavelength provided that its thermal, mechanical and electrical properties are compatible with the processing and the intended use. It can theoretically be made of any transparent material such as sapphire, aluminas or more expensive glasses. However, when thin film transistors are used in large display panels the cost of the materials makes them less preferred. Similarly, more exotic and expensive semiconductors could be used in the place of amorphous silicon 20 to increase the device speed and which would also have the similar light absorption problems. However, amorphous silicon, amorphous silicon-germanium, or amorphous silicon-carbon films are preferred in fabricating low-cost, large panel displays. The amorphous films are easier to work with and LCDs do not require fast response times. Plasma deposited amorphous silicon, commonly known as hydrogenated amorphous silicon is particularly preferred because its electrical properties are well matched to the LCD requirements. The gate insulator layers 16 and 18 can be made of any transparent insulating material but 16 must have a refractive index different than the substrate 14. Any inorganic thin film insulator, or polymer materials such as polyimide may be used. However, in the manufacture of low cost, large panel displays, silicon dioxide, $SiO_2$, or silicon nitride, $Si_3N_4$, films are preferred. It is understood that silicon dioxide and silicon nitride include plasma CVD versions of these materials which are known to incorporate various amounts of hydrogen.

Figure 2A:
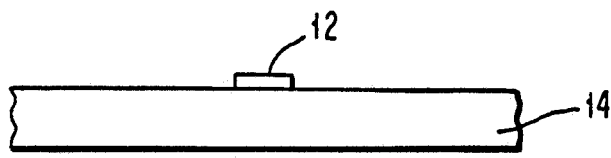
FIG. 2a-2e are cross-section views illustrating on preferred method of the present invention.
Figure 2B:
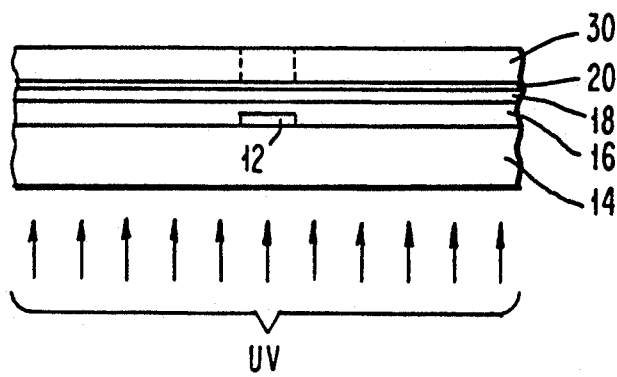
Figure 2C:
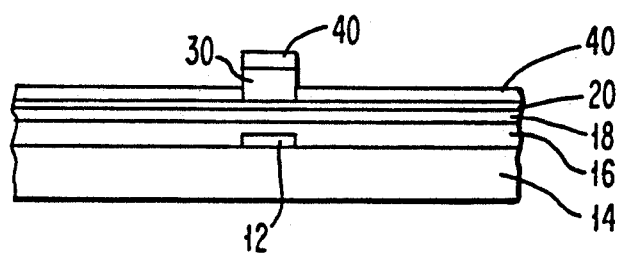
Figure 2D:
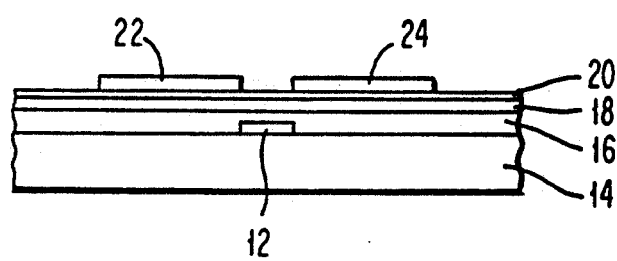
Figure 2E:
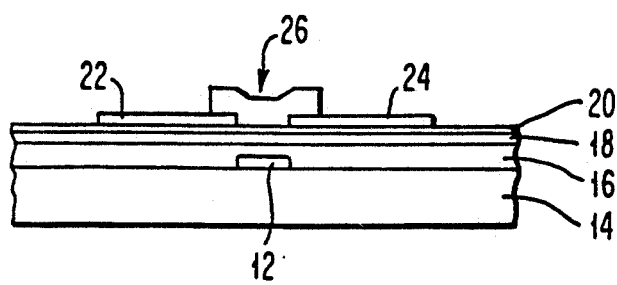

A process for forming a thin film transistor such as one shown in FIG. 1 is described with references to FIGS. 2a-2e. In FIG. 2a, a gate electrode 12 is formed on a glass substrate 14. The gate electrode 12 may be formed of Ni-Cr or other suitable alloys. In FIG. 2b, gate insulator layers 16 and 18 are deposited over the substrate 14 and gate electrode. Optionally, only one gate insulator layer 16 may be deposited. An amorphous semiconductor layer 20 is deposited via a plasma or plasma CVD process.

A positive photoresist layer 30 is applied to the entire surface, and UV light is transmitted through the substrate, insulator films 16, 18 and amorphous semiconductor material 20. In the present invention, the thicknesses of the insulator films 16, 18 are chosen to maximize the amount of photolithographically active light to the photoresist 30.

Figure 3A:
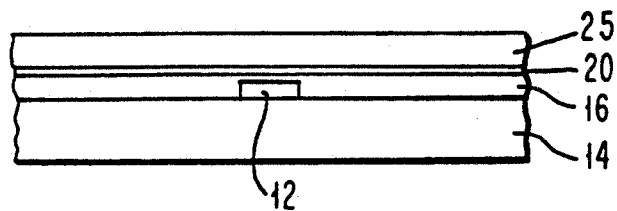
FIG. 3a-3e are cross-section views illustrating another preferred method of the present invention.
Figure 3B:
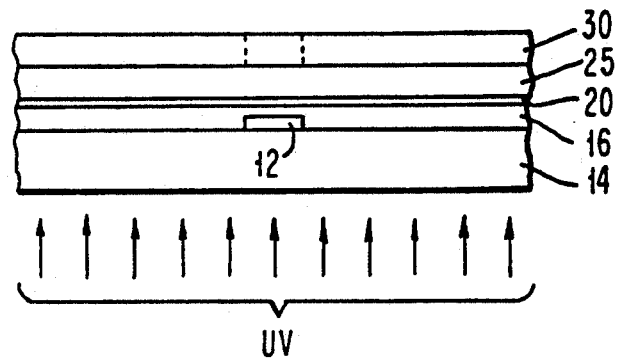
Figure 3C:
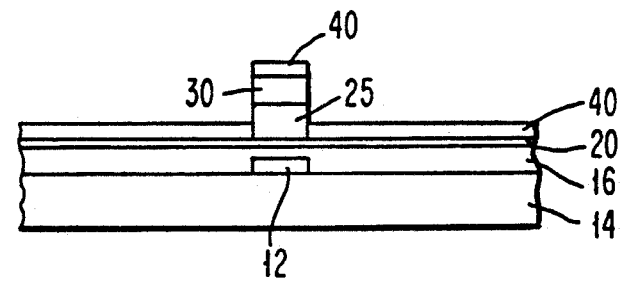

Only the portion of the photoresist film 30 over the gate electrode 12 is not exposed, and therefore, only this portion is left after developing, as shown by FIG. 3c. A conductive layer 40, typically a metal such as aluminum is deposited over the structure. When the photoresist film 30 is removed by a solvent, the conductive layer 40 deposited on the photoresist film is removed. This leaves a gap over the gate electrode 12. The part of layer 40 not removed in this lift-off process form the source electrode 22 and the drain electrode 24. Their edges in the gap, as formed in this process, are aligned with the edges of the gate electrode within a precision of the wavelength of the light. Patterning of the interconnections to 22 and 24 do not require the precision necessary for the gap. Therefore, it can be performed, if not conveniently defined by the gate metallization, with a subsequent lithographic step requiring only coarse alignment of masks. Finally, a second amorphous silicon layer 26 is deposited on the top surface of the structure and patterned so that it is left in the gap above the gate electrode 12 and covers at least a portion of both source electrode 22 and drain electrode 24.

Referring to FIGS. 3a-3b, another embodiment of the process according to the present invention is described. In FIG. 3a, a gate electrode 12, gate insulator layer 16, an amorphous silicon layer 20 and a capping layer 25 are consecutively deposited on a glass substrate 14. The gate insulator layer 16 or capping layer 25 can be composed of one or more transparent films. However, only one is illustrated. In FIG. 3b, a photoresist film 30, which may be a positive type AZ1350J is applied and exposed to UV rays. The capping layer 25 must have a refractive index different than that of the photoresist 30. The gate electrode 12 is light impermeable and acts as a mask for the photoresist film 30.

Figure 3D:
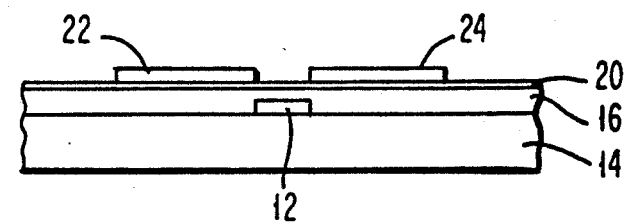
Figure 3E:
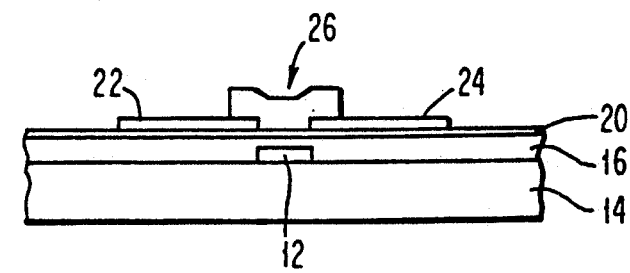

In FIG. 3c, the film 30 is then used as a mask to selectively remove the exposed portion of capping layer 25. This can be done with an etchant which will etch insulator layers such as $SiO_2$ and $Si_3N_4$ but which will not attack the amorphous semiconductor layer 20. Aluminum, or another metal, is deposited and then selectively removed by means of a lift-off or metal etch process, so as to form the source electrode 22 and the drain electrode 24 depicted in FIG. 3d.

Depending on the thickness of the amorphous silicon film, the capping layer 25 between the source and drain electrodes 22, 24 may be removed and additional amorphous silicon 26 deposited over the gate electrode.

The exposure rate of the photoresist 30 used in preparing the lift-off stencil in both the processes shown in FIGS. 2b and 3b is proportional to flux of the photolithographically active light ultimately absorbed by the resist. This flux can be increased by increasing (1) the light output of the light source, (2) the fraction of the light absorbed by the photoresist, or (3) the fraction of the light transmitted by the structure in-between the light source and the photoresist. More precisely, in the language of mathematics, the exposure rate is proportional to the integral over all lithographically active wavelengths of the product of the emission spectrum of the light source, of the absorption spectrum of the sensitizer of the resist, and of the transmission spectrum of the intervening structure.

The light absorption in the Shipley AZ-1350 or equivalent positive resist, starts at a wavelength of approxximately 460 nanometer (nm), but becomes strong only below 420 nm. Lithographic tools used for transmitting light through the structures typically employ mercury arc lamps as light sources. Therefore, the spectrum of the lamp consists of mercury lines, the 366 nm group being dominant. On the short wavelength side, the useful range is limited by the absorption in glass plates to about 320 nm. Although there is some contribution to resist exposure from the 405 and 436 nm lines, the lithographically active light can be considered as nearly monochromatic at 366 nm. Therefore to practice this invention with standard lithographic tools and resists, it is adequate to design the structure in a manner that its transmittance is maximized for the single wavelength of 366 nm.

The transmittance of multilayer structures for monochromatic light is predicted by well-known theory described in Principles of Optics, by Max Born and Emil Wolf, published by Pergamon Press, sixth edition, 1980, and herein incorporated by reference. Briefly, the transmittance of a multilayer structure is that fraction of the incident light which is not lost to absorption, reflection, or scattering. Scattering is a negligible loss mechanism in the structures considered here. Absorption is minimized if the light traverses the absorbing layer only once, that is by minimizing multiple reflections on either side of the absorbing layer that cause the light to travel back and forth. Reflection takes place whenever light traverses an interface at which the refractive index changes. The intensity of the reflected light from a multilayer structure is minimized if the wave components reflected at the various interfaces interfere destructively, which happens when their amplitudes are 180 degrees out of phase. The above cited reference gives a more thorough description of the phenomena involved, and provides formulae for the calculation of the absorbance, the reflectance, and hence the transmittance of such multilayer structures for any combination of layer thicknesses to enable one to calculate the optimal thicknesses. However, it is easier to use available digital computer programs which have been constructed to compute, if the optical constants of the materials comprising the layers are known, the transmittance of the structure and optimal choices for layer thicknesses. The mathemathical formulae required to calculate the optimal thicknesses are known and are not themselves considered part of the present invention.

For the intermediate structure described in one known prior art process, 300.0 nm $SiO_2$ and 12.0 nm a-Si:H sandwiched between Corning 7059 glass and photoresist, the reflectance, absorbance and transmittance for 366 nm light can be computed, respectively, at 48.5, 47.8 and 13.7 percent. Significant improvement in light transmission is achieved by any of several structures designed according to the present invention as illustrated in Table I. Table I lists the optimal choices of the non-absorbing layer thicknesses computed for various combinations of layers. Structures 1-4 correspond to the process illustrated by FIG. 2b; structures 5-7 correspond to FIG. 3b.

Structure 1 illustrates that an improvement in transmission from 13.7 to 19.7 percent is achieved by simply replacing the 300 nm oxide with a properly chosen thickness of a dielectric with a refractive index in between that of the substrate and of the amorphous silicon film. The ratio of the optical thickness (nd) to the wavelength of light to give a maximum in transmittance in this example is 1.245. Similar maxima in transmission were computed for nd/$\lambda$ values of 0.745, 1.745, 2.245, electrical reasons silicon dioxide is preferred over nitride to be the insulator adjacent to the amorphous semiconductor.

Structure 4 illustrates that a slight further improvement in transmission is achieved by interposing below the nitride layer a properly chosen thickness of a dielectric with refractive index lower than the substrate.

Structures 5-7 illustrate that further increases in transmission can be obtained interposing between the amorphous semiconductor and the photoresist a properly chosen antireflective capping layers. Thus the results of Table I demonstrate that it is possible to tailor the insulator to maintain desired electrical characteristics of the final transistor while improving the transmittance.

It would be desirable to eliminate, after the source-drain metallization, the second plasma deposition of a-Si:H described in the prior art. To do this, the thickness of the original a-Si:H film must be sufficient for device operation, which is presently thought to be minimum 30 nm. At this thickness of a-Si:H, with a 300 nm $SiO_2$ gateinsulator, as suggested, the transmission of the structure is 4.1 percent. This is too low for practical applications. With an optimized optical thickness gate insulator, as described in the previous paragraphs the transmission can be raised to 5.6%, and with the addition of a proper interlayer between the a-Si:H and the photoresist, 7.0% transmission should be achievable. With this amount of light transmission to the photoresist, successful lithography is much more feasible. Table I.

Optimal choices of non-absorbing layer thicknesses in various structures to maximize transmisison of 366 nm light. The thickness of the a-Si:h layer was kept fixed at 12.0 nm. Other parameters used in the computations were: Index for a-Si:H—n=5.16, k=2.4; for Corning 7059 glass substrate—n=1.556; for photoresist—n=1.60. Layers are listed in order starting with those adjacent to photoresist.

TABLE I

| Structure # | Layers | n | nd/$\lambda$ | d (nm) | Reflectance | Absorbance | Transmittance |
|---|---|---|---|---|---|---|---|
| 1 | a-Si:H | 5.16 | 0.169 | (12.0) | 0.258 | 0.547 | 0.197 |
|  | $Si_3N_4$ | 2.0 | 1.245 | 227.8 |  |  |  |
| 2 | a-Si:H | 5.16 | 0.169 | (12.0) | 0.258 | 0.545 | 0.197 |
|  | $SiO_2$ | 1.476 | 0.496 | 123.0 |  |  |  |
|  | $Si_3N_4$ | 2.0 | 0.750 | 132.2 |  |  |  |
| 3 | a-Si:H | 5.16 | 0.169 | (12.0) | 0.258 | 0.545 | 0.197 |
|  | $SiO_2$ | 1.476 | 0.996 | 247.0 |  |  |  |
|  | $Si_3N_4$ | 2.0 | 0.250 | 45.7 |  |  |  |
| 4 | a-Si:H | 5.16 | 0.169 | (12.0) | 0.219 | 0.574 | 0.207 |
|  | $Si_3N_4$ | 2.0 | 0.745 | 136.3 |  |  |  |
|  | $SiO_2$ | 1.476 | 0.249 | 61.7 |  |  |  |
| 5 | $SiO_2$ | 1.476 | 0.492 | 122.0 | 0.259 | 0.544 | 0.197 |
|  | a-Si:H | 5.16 | 0.169 | (12.0) |  |  |  |
|  | $Si_3N_4$ | 2.0 | 1.245 | 227.8 |  |  |  |
| 6 | $Si_3N_4$ | 2.0 | 1.238 | 226.6 | 0.257 | 0.486 | 0.256 |
|  | a-Si:H | 5.16 | 0.169 | (12.0) |  |  |  |
|  | $Si_3N_4$ | 2.0 | 1.239 | 226.7 |  |  |  |
| 7 | $Si_3N_4$ | 2.0 | 0.239 | 43.7 | 0.257 | 0.486 | 0.256 |
|  | a-Si:H | 5.16 | 0.169 | (12.0) |  |  |  |
|  | $Si_3N_4$ | 2.0 | 1.219 | 223.1 |  |  |  | etc. separated by deep minima. Note that the maxima occur at optical thicknesses close to but not identical to odd multiples of one fourth the wavelength, which would be the prediction of an approximate theory that disregards absorption in the amorphous silicon layer.

Structures 2 and 3 illustrate that interposing properly chosen thicknesses of silicon dioxide will achieve the same transmission maximum as optimal thicknesses of silicon nitride alone. These structures are useful if for While the invention has been described with respect to the particular embodiments above, it would be understood by those skilled in the art that modifications may be made without departing from the spirit and scope of the present invention. For example, the gate insulator could comprise more than the stated two layers. This might be useful if its function were, in addition to optimizing light transmission, to control more than one electrical property, say both the capacitance and the insulator-semiconductor interfacial charge density. Or it would be possible to fabricate the structures described above using more expensive semiconductors to speed the thin film transistor. As explained above, exotic semiconductors would be unnecessary in fabricating large panel liquid crystal displays. While the embodiments described have been thin film transistors for large panel LCDs, they have broader application Wherever a photoresist layer is exposed through a series of layers one of which is a light scattering or light absorbing layer. These embodiments are for purposes of example and illustration only and are not to be taken to limit the scope of the invention narrower than the appended claims.

We claim:

1. A process for fabricating a thin film semiconductor device on a transparent substrate, comprising:

depositing a gate electrode on said transparent substrate, selecting at least one lower transparent insulating layer material, having a refractive index different from said transparent substrate, in combination with a thickness of at least one lower transparent insulating layer such that said lower transparent insulating layer thickness multiplied times said lower transparent insulating layer refractive index approximately equals an odd multiple of one fourth of the wavelength of lithographically active light transmitted through said transparent substrate, depositing at least one lower transparent insulating layer having said selected refractive index and thickness over said transparent substrate and said gate electrode, depositing a thin light-permeable semiconductor layer having a light absorbing property over said lower transparent insulating layer, applying a photoresist layer over said light-permeable semiconductor layer, and exposing said photoresist layer by transmitting said lithographically active light through said transparent substrate, said transparent insulating layers, and said light-permeable semicondcutor layer to said photoresist layer.

2. A process for fabricating a thin film semiconductor device as recited in claim 1 which further comprises:

selecting at least one upper transparent insulating layer material, having a refractive index different from said transparent substrate, in combination with a thickness of at least one upper transparent insulating layer such that said upper transparent insulating layer thickness multiplied times said upper transparent insulating layer refractive index approximately equals an odd multiple of one fourth of the wavelength of said lithographically active light transmitted through said transparent substrate, and depositing at least one upper transparent insulating layer, having said selected refractive index and thickness, between said light-permeable semiconductor layer and said photoresist layer.

3. A process for fabricating a thin film semiconductor device as recited in claim 2, wherein sad transparent insulating layers are chosen from the group consisting of silicon dioxide and silicon nitride.

4. A process for fabricating a thin film semiconductor deice as recited in claim 2, wherein said light-permeable semiconductor layer is amorphous silicon.

5. A process for fabricating a thin film semiconductor device as recited in claim 2, wherein said substrate comprises glass.

6. A process for fabricating a thin film semiconductor device as recited in claim 1, wherein said transparent insulating layers are chosen from the group consisting of silicon dioxide and silicon nitride.

7. A process for fabricating a thin film semiconductor device as recited in claim 1, wherein said light-permeable semiconductor layer is amorphous silicon.

8. A process for fabricating a thin film semiconductor device as recited in claim 1, wherein said substrate comprises glass.

9. A process for fabricating a thin film semiconductor device on a transparent substrate, comprising:

selecting at least one lower transparent insulating layer material, having a refractive index different from said transparent substrate, in combination with a thickness of at least one lower transparent insulating layer such that said lower transparent insulating layer thickness multiplied times said lower transparent insulting layer refractive index approximately equals an odd multiple of one fourth of the wavelength of lithographically active light transmitted through said transparent substrate, selecting at least one upper transparent insulating layer material, having a refractive index different from said transparent substrate, in combination with a thickness of at least one upper transparent insulating layer such that said upper transparent insulating layer thickness multiplied times said upper transparent insulating layer refractive index approximately equals an odd multiple of one fourth of the wavelength of said lithographically active light transmitted through said transparent substrate, depositing at least one lower transparent insulating layer having said selected refractive index and thickness on said transparent substrate, depositing at least one thin film, light-permeable layer having a light absorbing property, over said lower transparent insulating film, and depositing at least one upper transparent insulating layer having said selected refractive index and thickness over said light-permeable layer.

* * * * *